United States Patent
Qu et al.

(10) Patent No.: US 10,653,033 B1
(45) Date of Patent: May 12, 2020

(54) KITS FOR ENHANCED COOLING OF COMPONENTS OF COMPUTING DEVICES AND RELATED COMPUTING DEVICES, SYSTEMS AND METHODS

(71) Applicant: Micron Technology, Inc., Boise, ID (US)

(72) Inventors: Xiaopeng Qu, Boise, ID (US); Hyunsuk Chun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/174,810

(22) Filed: Oct. 30, 2018

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20154* (2013.01); *H05K 7/20172* (2013.01)

(58) Field of Classification Search
CPC ..... H01L 23/467; H01L 23/427; G06F 1/203; G06F 1/181; G06F 2200/201; H05K 7/20736; H05K 7/20145; H05K 7/20745; H05K 7/20172; H05K 7/20727; H05K 7/20136; H05K 7/20; H05K 7/20754; H05K 7/20336; H05K 1/144; H05K 5/0213; H05K 7/2039; H05K 1/141; F24F 11/30; F24F 2110/10; F24F 2110/20
See application file for complete search history.

(56) References Cited

U.S. PATENT DOCUMENTS

| | | | |
|---|---|---|---|
| 2003/0169567 A1* | 9/2003 | Tantoush | G06F 1/20 361/695 |
| 2006/0061966 A1* | 3/2006 | Korinsky | G06F 1/20 361/695 |
| 2007/0153476 A1* | 7/2007 | Yang | H01L 23/427 361/695 |
| 2008/0295999 A1* | 12/2008 | Mitsui | H01L 23/467 165/104.33 |
| 2011/0014861 A1* | 1/2011 | Tsai | G06F 1/20 454/184 |

* cited by examiner

*Primary Examiner* — Adam B Dravininkas
(74) *Attorney, Agent, or Firm* — TraskBritt (57) ABSTRACT

Kits for cooling computing devices may include at least one heat-generating component and a fan. A first duct may be sized and shaped to surround the at least one heat-generating component on three sides to direct a portion of air flow from the fan. A second duct may be sized and shaped to extend over the first duct and direct another portion of air flow between the first and second ducts. The at least one heat-generating component may comprise multiple vertically and longitudinally aligned memory modules Computing devices, electronic systems and methods of cooling are also disclosed.

23 Claims, 5 Drawing Sheets

KITS FOR ENHANCED COOLING OF COMPONENTS OF COMPUTING DEVICES AND RELATED COMPUTING DEVICES, SYSTEMS AND METHODS

FIELD

This disclosure relates generally to devices, systems, structures, kits, methods, and techniques for enhanced cooling of computing devices and components thereof. More specifically, disclosed embodiments relate to configurations for ducts that may better direct flow of at least portions of a cooling fluid around heat-generating electronic components, may better direct flow of other portions of the cooling fluid over the ducts themselves, and may optionally enable conductive transfer of heat from the heat-generating components.

BACKGROUND

Components of computing devices that consume electrical power, such as logic devices and memory devices, also generate heat during operation. Certain heat-generating components, such as logic devices (e.g., memory controllers, central processing units (CPUs), graphics processing units (GPUs), application specific integrated circuits (ASICs), field programmable gate arrays (FPGAs), digital signal processors (DSPs)), emit far more heat than other components such as memory, and such excess heat may compromise operation and shorten the life of both types of components. Heat management techniques for the heat-generating components of computing devices may generally include thermally coupling a heat sink to a heat-generating component (e.g., using a thermal interface material), providing air flow over and around the heat-generating component (e.g., using a fan), or thermally coupling a liquid cooling apparatus to the heat-generating component. In solutions employing air cooling, a duct may be provided to direct the airflow along a desired flow path.

Specific thermal management problems arise in the case of servers comprising CPUs and multiple memory modules, such as dual in-line memory modules (DIMMs) each comprising multiple DRAM chips and buffer memory. When unconstrained cooling air flow is directed over one or more CPUs directionally followed by multiple, vertically extending memory modules, a significant volume of air flows over, rather than between, the memory modules, negating much of the effect of high power cooling fans. In another common server configuration, two banks of vertically extending memory modules flank one or more CPUs. Air flow directed by one or more cooling fans parallel to the memory modules flows primary in the corridor between the banks of memory modules and over the one or more CPUs, again largely negating the effect of high power cooling fans.

The use of a single duct extending over memory modules to constrain air flow to a volume immediately surrounding the memory modules and between the memory modules, issues of excessive memory operating temperatures remain. Such issues arise from limitations in using conventional single air duct configurations. To improve cooling capability using a single air duct, higher air speed is required. However, there are at least two problems associated with higher air speeds. First, when air speed is relatively low, for example less than two m/s, a slight increase in air speed can dramatically improve thermal performance. However, when the employed air speed is already relatively high, for example greater than about three m/s, the effect of air speed on cooling performance becomes ever-more negligible as air speed increases. Further, higher speed requirements dictate more power consumption from the fans and more noise from the cooled system.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular computing device or component thereof, but are merely idealized representations employed to describe illustrative embodiments. Thus, the drawings are not necessarily to scale.

Disclosed embodiments relate generally to configurations for ducts that may better direct flow of at least portions of a cooling fluid (e.g., air) adjacent to and around heat-generating components, may better direct flow of other portions of the cooling fluid over the ducts themselves, and may optionally enable conductive transfer of heat from the heat-generating components. More specifically, disclosed are embodiments of duct assemblies for computing devices that may include multiple ducts, one immediately proximate to the heat-generating components and another surrounding the first duct, which may be formed from materials having high thermal conductivity, and may enable thermal coupling of a heat sink to the heat-generating component or components via the first duct.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

As used herein, spatially relative terms, such as "beneath," "below," "lower," "bottom," "above," "upper," "top," "front," "rear," "left," "right," and the like, are used only for ease of description to describe one element's or feature's relationship to another element(s) or feature(s) as illustrated in the figures. Unless otherwise specified, the spatially relative terms are intended to encompass different orientations in addition to the orientation depicted in the figures. For example, if features in the figures are inverted, elements described as "below" or "beneath" or "under" or "on bottom of" other elements or features will then be oriented "above" or "on top of" the other elements or features.

Figure 1:
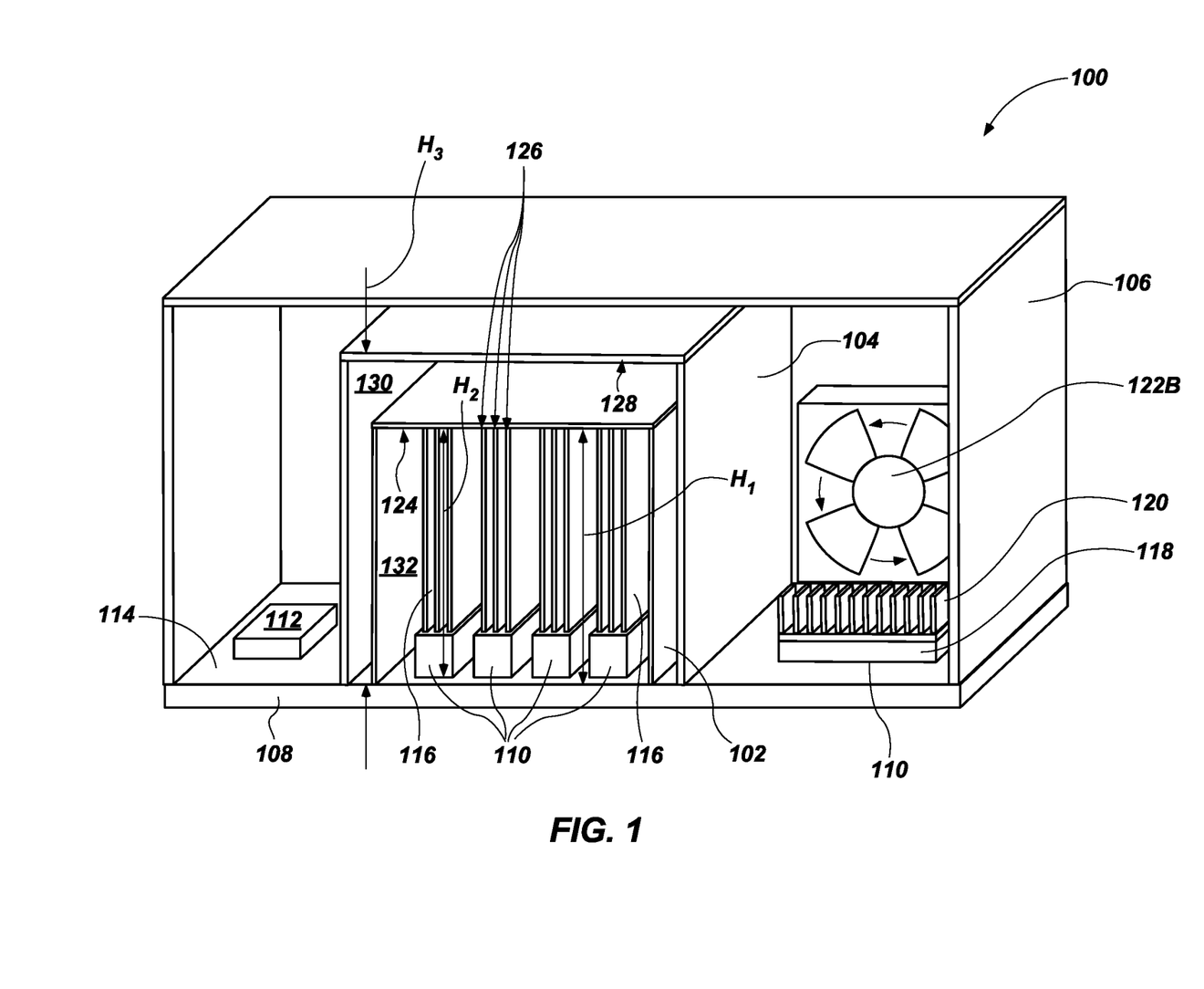
FIG. 1 is a perspective side view of a computing device including ducts in accordance with this disclosure.

FIG. 1 is a perspective side view of a computing device 100 including ducts 102 and 104 in accordance with this disclosure. The computing device 100 may be configured, for example, as a personal computing device, desktop, laptop, tablet, server, server module, programmable logic controller (PLC), gaming cabinet or console, or another device configured to process, store and output data electrically in response to input. The computing device 100 may include a case 106 sized and shaped to accommodate and protect interior components therein and to form at least a portion of an exterior of the computing device 100. Though the case 106 shown in FIG. 1 is depicted as extending around, and forming an exterior surface of, three sides of the computing device 100 (i.e., top, left, and right sides), in other embodiments the case 106 may extend around, and form an exterior surface of, more or fewer sides. For example, the case 106 may extend entirely around, and enclose, all the other components of the computing device 100, though vent holes and other apertures providing communication between the interior and the exterior of the case 106 may be provided.

A substrate 108 may be secured to the case 106. The substrate 108 may be configured to support other components of the computing device 100 thereon, and provide operative connection between at least certain of the components. The substrate 108 may be configured as, for example, a motherboard, printed circuit board (PCB), system board, logic board, interposer, or another device configured to support and provide operative connection between other components of the computing device 100. In some embodiments, such as that shown in FIG. 1, the substrate 108 may form a bottom, exterior surface of the computing device 100. In other embodiments, the substrate 108 may be encased and supported by the case 106, such that the case 106 may extend between the substrate 108 and the exterior of the computing device 100. The substrate 108 may include one or more receivers 110 (e.g., sockets, slots, power connections, data connections, etc.) located on an upper extent (e.g., an upper surface 114 or edge) of the substrate 108 within the case 106. The receivers 110 may be configured to receive other components, mechanically securing and operatively connecting them to the substrate 108. The substrate 108 may further include one or more integrated active and/or passive components 112 (e.g., system memory, a clock generator, a chipset, etc.) located on the upper surface 114 of the substrate 108 within the case 106. The integrated active and/or passive components 112 may be directly mechanically secured, and operatively connected, to the substrate 108 (e.g., by soldering, reflow of electrically conductive material, etc.).

At least one heat-generating component in the form of a nontransitory memory device 116 may be supported on the substrate 108. In some embodiments, multiple, vertically and longitudinally extending, mutually adjacent heat-generating components may be employed in computing device 100. For example, a group (e.g., a bank) of memory devices 116 in the form of multiple, longitudinally and vertically aligned memory modules may be mechanically secured, and operatively connected, to the substrate 108 via corresponding receivers 110 (e.g., slots). A number of memory devices 116 in each grouping may be, for example, one, two, four, eight, or more. The memory devices 116 may be configured as, for example, flash memory, read-only memory (ROM), programmable read-only memory (PROM), erasable programmable read-only memory (EPROM), electrically erasable programmable read-only memory (EEPROM), random access memory (RAM), static random-access memory (SRAM), dynamic random-access memory (DRAM), magnetic random access memory (MRAM), feeroelectric random access memory (FeRAM), or cache memory. As a specific, nonlimiting example, the memory devices 116 may be configured as dual in-line memory modules (DIMMs) including, for example, multiple double data rate (DDR), DDR2, DDR3, DDR4 RAM, or DDR5 RAM, semiconductor dice and buffer memory. Such memory devices, for example in the case of fifth generation double data rate (DDR) RAM may reach power levels of 15 W per DIMM, while having a reduced pitch of about 7.6 mm between mutually adjacent modules in a multi-module assembly.

A processor 118 may be supported on and operably coupled to the substrate 108. For example, the processor 118 may be mechanically secured, and operatively connected, to the substrate 108 via a receiver 110 (e.g., a socket). The processor 118 may be configured as, for example, a central processing unit (CPU), graphics processing unit (GPU), digital signal processor (DSP), application specific integrated circuit (ASIC), field-programmable gate array (FPGA), or microprocessor. As a specific, nonlimiting example, the processor 118 may be configured as a CPU, and may be seated in a receiver 110 configured as an appropriate socket. In some embodiments, a heat sink 120 may be thermally coupled to the processor 118 to assist in dissipating heat generated by the processor 118. For example, the heat sink 120 may be supported on an upper surface of the processor 118, and a thermal interface material (TIM), such as, for example, a thermal adhesive or thermal grease, may be interposed between the processor 118 and the heat sink 120. The heat sink 120 may include, for example, a material having high thermal conductivity (e.g., a metal or metal alloy) and may have fins, pipes, fans, and/or flowing cooling fluid to assist with heat dissipation.

At least one fan 122 may be supported on the substrate 108. For example, a first fan 122A (see FIG. 2) may be oriented to direct air flow toward the grouping of memory devices 116, and a second fan 122B may be oriented to direct air flow toward the processor 118. The fan 122 or fans 122A and 122B may be located proximate to a longitudinal end of the memory devices 116.

In some embodiments, additional components may be provided with the computing device 100. For example, the computing device 100 may include a power supply, additional nontransitory memory (e.g., hard drives, flash drives, etc.), a discrete graphics card, an optical drive, data ports, peripheral component interconnect (PCI) accessories, networking devices (e.g., wired or wireless networking devices), etc.

As devices, such as the memory devices 116 and processor 118, decrease in size and increase in power density, and as more and more memory devices 116 are added to provide next-generation functionality to computing devices 100, required heat transfer rates to maintain operating temperatures within acceptable ranges become more difficult to achieve. For example and as noted above, the provision of a fan to provide air flow, and increases to the speed of such air flow, have been attempted to dissipate generated heat. However, further increasing the speed of cooling already high-speed air flows has a smaller impact on operating temperature than providing air flow where there previously was none. The inventors have found that the provision of a single-walled air duct may also be inadequate to effectively maintain the operating temperatures of next-generation computing devices 100 within acceptable ranges. For example, a double-walled air duct may be provided around at least a grouping of the memory devices 116, which may synergistically, and unexpectedly, dissipate heat more effectively than increasing the speed of air flow and providing a single-walled air duct over memory devices 116.

The computing device 100 may include a first duct 102 sized and shaped to surround the grouping of memory devices 116 proximate to the grouping of memory devices 116 on three sides and to direct air flow from the first fan 122A (see FIG. 2) around the grouping of memory devices 116. The first duct 102 may be supported on the substrate 108, and may extend over the grouping of memory devices 116, and laterally adjacent to the grouping of memory devices 116 on two sides, between the grouping of memory devices 116 and the case 106. The first duct 102 may be at least substantially aligned with at least a portion of the first fan 122A (see FIG. 2), such that at least a portion of air flow generated by the first fan 122A (see FIG. 2) may flow through the first duct 102. The first duct 102 may form a flow path immediately around the grouping of memory devices 116, such that air flowing through the first duct 102 may be confined to flow through and around the grouping or memory devices 116. Absent the first duct 102 and as noted above, air flow from the first fan 122A (see FIG. 2) may take a path of lesser resistance, such that less air may flow directly around and between the grouped memory devices 116.

At least the first duct 102 may include a material exhibiting a high thermal conductivity, which may enable the first duct 102 to better dissipate heat from the memory devices 116. For example, the first duct 102 may include a metal material, such as a metal or metal alloy material. More specifically and without limitation, the first duct 102 may include, for example, a copper, copper alloy, aluminum, or aluminum alloy material.

The computing device 100 may include a second duct 104 sized and shaped to surround the first duct 102 on three sides, such that the first duct 102 is interposed between the grouping of memory devices 116 and the second duct 104. The second duct 104 may be supported on the substrate 108, and may extend over the first duct 102, and laterally adjacent to the first duct 102 on two sides, between the first duct 102 and the case 106. The second duct 104 may be at least substantially aligned with at least a portion of the first fan 122A (see FIG. 2), such that at least another portion of the air flow generated by the first fan 122A (see FIG. 2) may flow through the second duct 104. The second duct 104 may be spaced from, and form a flow path immediately around the first duct 102, such that a longitudinally extending volume exists between the first duct 102 and the second duct 104 and air flowing through the second duct 104 may be confined to flow over and around the first duct 102. In an embodiment, the flow path between the first duct 102 and the second duct 104 may be of U-shaped cross-section.

The second duct 104 may include a material having high thermal conductivity or a relatively lower thermal conductivity. For example, the second duct 104 may include a metal material such as a metal or metal alloy, or a polymer material. More specifically, the second duct 104 may include, for example and without limitation, a copper, copper alloy, aluminum, aluminum alloy, thermoplastic, or thermoset material. The second duct 104 may enable air flowing therethrough to further dissipate heat from the memory devices 116 via convection.

In some embodiments, such as that shown in FIG. 1, the processor 118 may be located outside the first duct 102 and the second duct 104. For example, the processor 118 may be located laterally adjacent the second duct 104 in a volume between the second duct 104 and a wall of the case 106. In some such embodiments, the computing device 100 may include a second fan 122B positioned and oriented to direct cooling air flow over and around the processor 118, at least substantially outside the first duct 102 and the second duct 104, through the case 106.

A minimum height $H_1$ of an underlying surface 124 of the first duct 102 positioned to be located proximate to the memory devices 116 may be, for example, greater than, or at least substantially equal to, a greatest height $H_2$ of any one of the upper surfaces 126 of the memory devices 116, as measured in a direction at least substantially perpendicular to the upper surface 114 of the substrate 108 from the upper surface 114 of the substrate 108. More specifically, the height $H_1$ of the underlying surface 124 of the first duct 102 located adjacent to the memory devices 116 may be at least substantially equal to the heights $H_2$ of each of the upper surfaces 126 of the memory devices 116 above the upper surface 114 of the substrate 108, such that the first duct 102 may be in contact with the memory devices 116 at their upper surfaces 126.

In some embodiments, such as that shown in FIG. 1, the underlying surface 124 of the first duct 102 facing the substrate 108 may be thermally coupled to the upper surface 126 of at least one memory device 116 in the grouping. For example, the underlying surface 124 of the first duct 102 may be in contact with the upper surface 126 of each memory device 116 in the grouping, optionally with a thermal interface material interposed therebetween. The high thermal conductivity of the first duct 102 may better enable the first duct 102 to dissipate heat from the memory devices 116, acting as a heat spreader. Thermally coupling the first duct 102 to the memory devices 116 may enable the first duct 102 to dissipate heat from the memory devices 116 via conduction, in addition to the convective heat transfer from flowing air. Air flowing between the second duct 104 and the first duct 102 may better dissipate heat absorbed conductively by the first duct 102 via convention.

Figure 2:
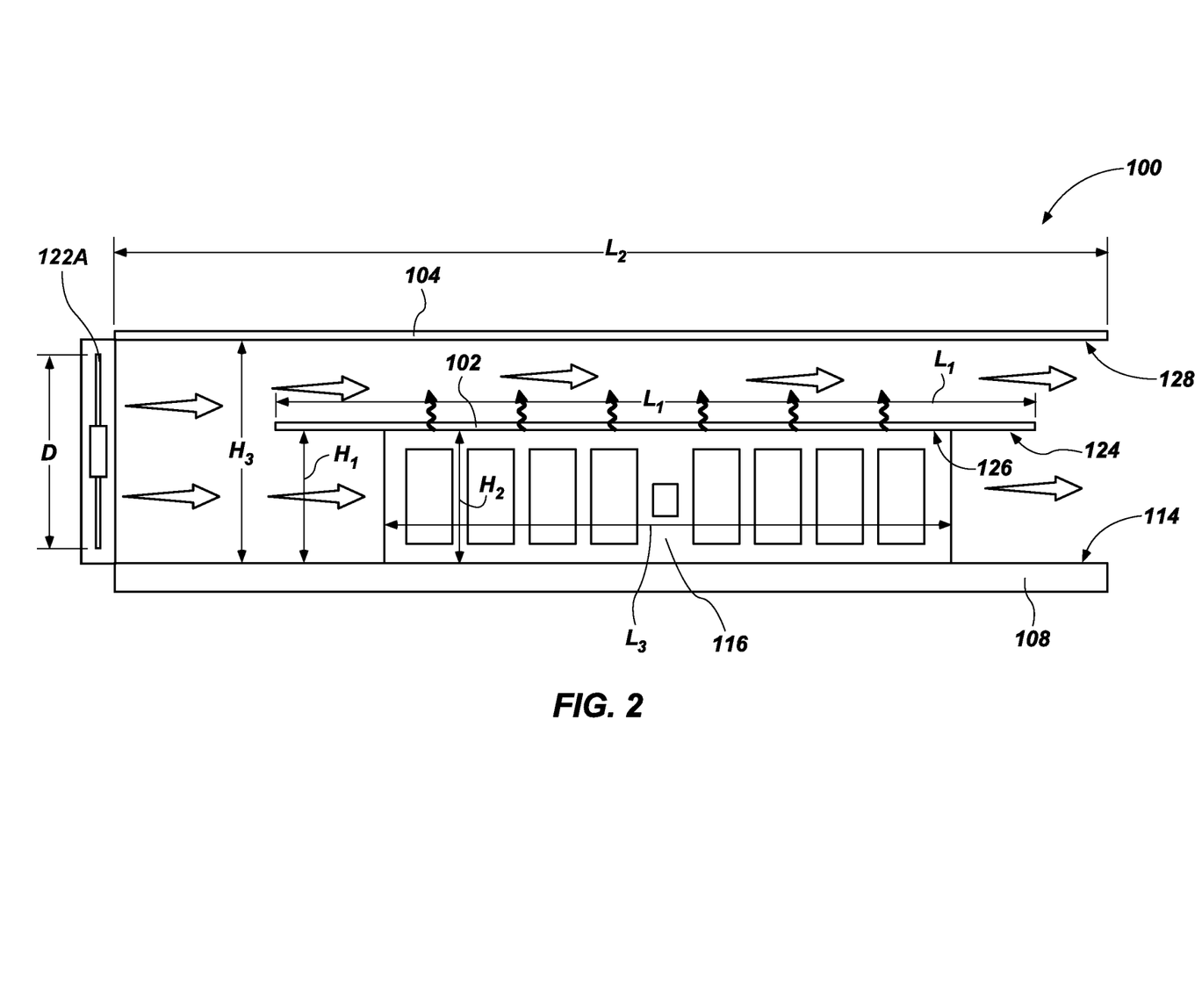
FIG. 2 is a cross-sectional side view of a portion of an interior of the computing device of FIG. 1.

FIG. 2 is a cross-sectional side view of a portion of an interior of the computing device 100 of FIG. 1. A maximum diameter D of the first fan 122A may be, for example, greater than, at least substantially equal to, or less than a minimum height $H_3$ of an underlying surface 128 of the second duct 104 facing the first duct 102 as measured from the upper surface 114 of the substrate 108. More specifically, the diameter D of the first fan 122A may be, for example, less than or at least substantially equal to the height $H_3$ of the underlying surface 128 of the second duct 104, and the first fan 122A may be at least substantially aligned with the second duct 104, such that at least a majority, and potentially all, of the air flow generated by the first fan 122A may be confinable within the second duct 104 in some embodiments. As a specific, nonlimiting example, the diameter D of the first fan 122A may be less than the height $H_3$ of the underlying surface 128 of the second duct 104, the diameter D of the first fan 122A may be located within the periphery of the second duct 104, the first fan 122A may be oriented such that a direction of airflow generated by the first fan 122A is at least substantially parallel to an edge formed at an intersection between the underlying surface 128 of the second duct 104 and a side surface 130 (see FIG. 1) of the second duct 104, and the first fan 122A may be located adjacent to, or at least partially within, at least the second duct 104.

The maximum diameter D of the first fan 122A may be, for example, greater than, at least substantially equal to, or less than the minimum height $H_1$ of the underlying surface 124 of the first duct 102 as measured from the upper surface 114 of the substrate 108. More specifically, the diameter D of the first fan 122A may be, for example, greater than or at least substantially equal to the height $H_1$ of the underlying surface 124 of the first duct 102, and the first fan 122A may be only partially aligned with the first duct 102, such that at least some, and up to a majority, of the air flow generated by the first fan 122A may be confinable within the second duct 104 in some embodiments. As a specific, nonlimiting example, the diameter D of the first fan 122A may be greater than the height $H_1$ of the underlying surface 124 of the first duct 102, the first fan 122A may be oriented such that a direction of airflow generated by the first fan 122A is at least substantially parallel to an edge formed at an intersection between the underlying surface 124 of the first duct 102 and a side surface 132 of the first duct 102, and the first fan 122A may be located proximate to the first duct 102.

A first length $L_1$ of the first duct 102 may be, for example, greater than, at least substantially equal to, or less than a second length $L_2$ of the second duct 104, as measured in a direction at least substantially parallel to the intended direction of airflow therethrough. More specifically, the first length $L_1$ of the first duct 102 may be, for example, less than or at least substantially equal to the second length $L_2$ of the second duct 104, and the first duct 102 may be located at least partially within the second duct 104. As a specific, nonlimiting example, the first length $L_1$ of the first duct 102 may be, for example, less than the second length $L_2$ of the second duct 104, and the first duct 102 may be located entirely within the second duct 104. The first length $L_1$ of the first duct 102 may be, for example, greater than, at least substantially equal to, or less than a greatest third length $L_3$ of the memory devices 116 in the grouping. More specifically, the first length $L_1$ of the first duct 102 may be, for example, greater than or at least substantially equal to the third length $L_3$ of the memory devices 116 in the grouping. As a specific, nonlimiting example, the first length $L_1$ of the first duct 102 may be greater than the third length $L_3$ of the memory devices 116 in the grouping, as shown in FIG. 2.

Figure 3:
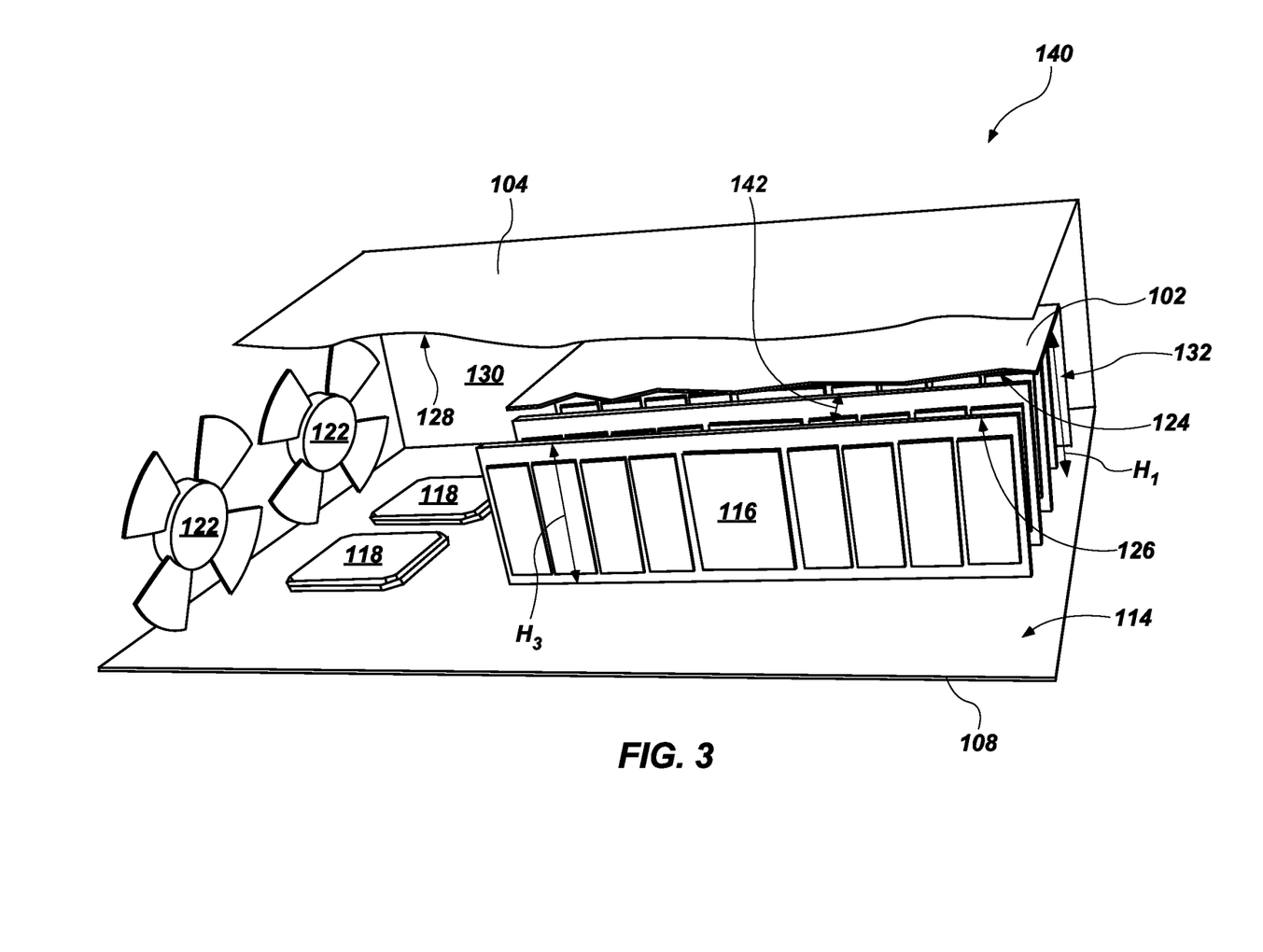
FIG. 3 is a partial cutaway perspective side view of another portion of a computing device including ducts in accordance with this disclosure showing another configuration for fans relative to the ducts.

FIG. 3 is a partial cutaway perspective side view of another portion of a computing device 140 including the first duct 102 and the second duct 104 in accordance with this disclosure and showing another configuration for fans 122 relative to the first duct 102 and the second duct 104. As shown in FIG. 3, the fans 122 may be spaced from the first duct 102 and the memory devices 116 located therein by a distance. For example, at least one processor 118 may be interposed between the fans 122 and the first duct 102 and associated memory devices 116, such that air flow from the fans may cool the processor 118 or processors 118 as well as the grouping of memory devices 116. In such embodiments, the second duct 104 may extend longitudinally toward the processor more than the first duct 102. In some such embodiments, the second length $L_2$ of the second duct 104 may be greater than the first length $L_1$ of the first duct 102, and at least the processor 118 or processors 118 may be located within at least the second duct 104, in addition to the first duct 102 and associated memory devices 116 (or portions thereof). The fans 122 may be located adjacent to, or may be located at least partially within, the second duct 104.

As shown in FIG. 3, the minimum height $H_1$ of the underlying surface 124 of the first duct 102 may be greater than the greatest height $H_3$ of any one of the memory devices 116 in the grouping, such that a space 142 may remain between the first duct 102 and each memory device 116. In such embodiments, heat transfer away from the memory devices 116 may occur primarily, or even exclusively, by convection. Direct conduction from the memory devices 116 to the first duct 102 may not occur, though some heat may transfer conductively from the memory devices, through the substrate 108, to the first duct 102. In embodiments where the space 142 is present between the first duct 102 and each memory device 116, a size of the space 142 may be, for example, at least 1 mm, as measured in a direction at least substantially perpendicular to the upper surface 114 of the substrate 108. In other embodiments, such as that shown in FIG. 4, no such space 142 may be present between the first duct 152 and each memory device 116.

Figure 4:
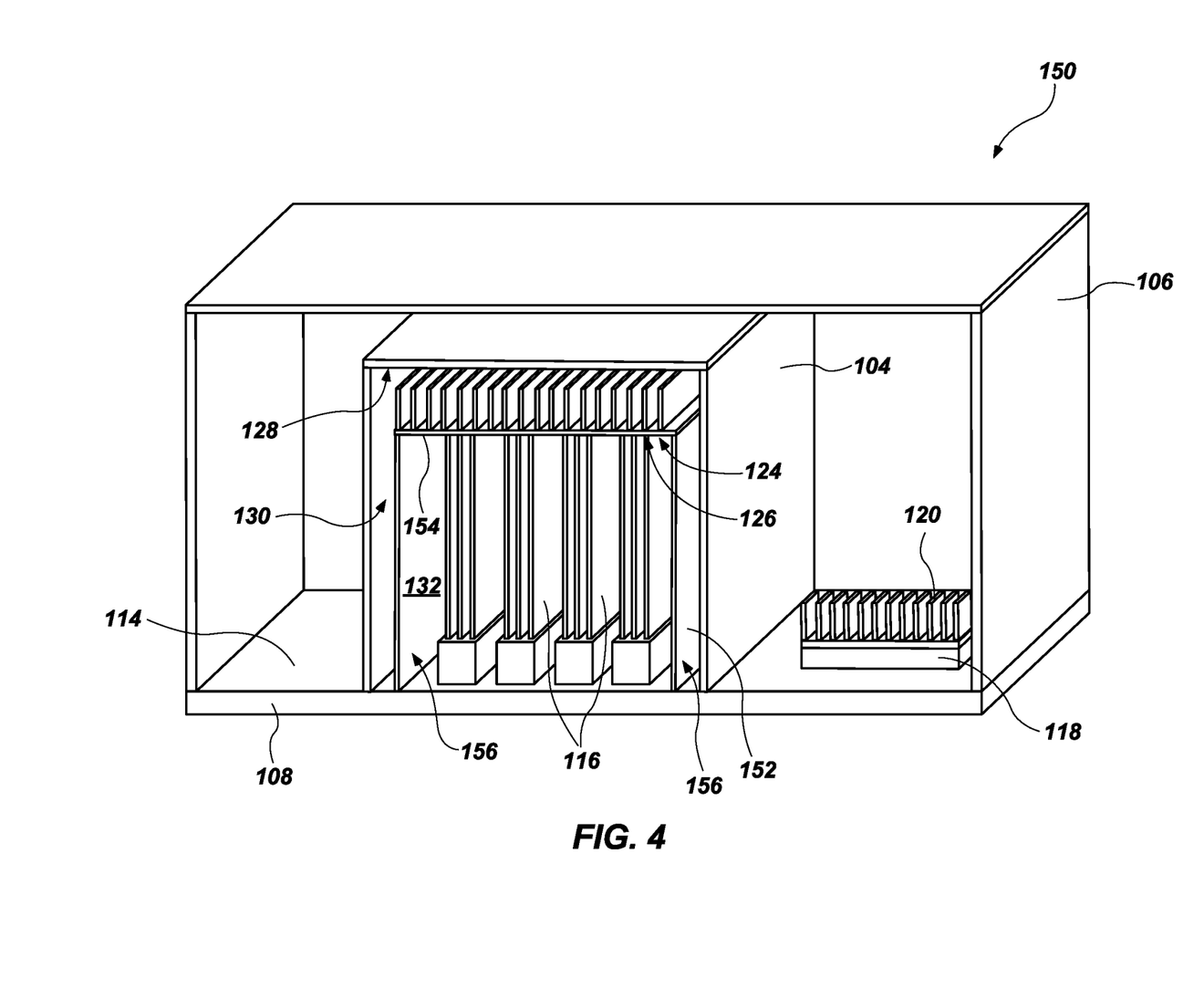
FIG. 4 is a cross-sectional side view of another computing device including other embodiments of ducts in accordance with this disclosure.

FIG. 4 is a cross-sectional side view of another computing device 150 including other embodiments of ducts in accordance with this disclosure. For example, in some embodiments, the first duct 152 may include a heat sink 154 located on a side of the first duct 152 for positioning opposite the memory devices 116 in the grouping. More specifically, the first duct 152 may include a heat sink 154 interposed between the memory devices 116 and the second duct 104. The heat sink 154 may be thermally coupled to the memory devices 116 by, for example, contacting the underlying surface 124 of the first duct 152 to the upper surfaces 126 of the memory devices 116, optionally with a TIM therebetween. The heat sink 154 may include, for example, a material having high thermal conductivity (e.g., a metal or metal alloy) and may include fins, pipes, fans, and/or flowing cooling fluid to assist with heat dissipation. In some embodiments, the heat sink 154 may be unitary with, and integral to, a remainder 156 of the first duct 152. For example, the heat sink 154 may be formed at the same time as, and from the same material as, the remainder 156 of the first duct 152, such that no boundary may be distinguishable between the heat sink 154 and the remainder 156 of the first duct 152. In other embodiments, the heat sink 154 may be distinct from, and secured to, the remainder 156 of the first duct 152. For example, the heat sink 154 may be formed separately from, and may include a different material than, the remainder 156 of the first duct 152. In such an embodiment, more heat may be drawn conductively from the memory devices 116 into the flow path between the first duct 152 and the second duct 104 to be dissipated by convection into cooling fluid (e.g., air) flowing through the flow path.

In variations of the embodiments of FIGS. 1 and 4, it is contemplated that the duct systems depicted in each drawing figure may be modified to eliminate portions of the air flow path between the first and second ducts between adjacent vertical sides of the respective ducts. In other words, the air flow path would be solely above the top of first duct 102 or 152, and between the top of first duct 102 or 152 and the top of second duct 104. In such a variation, side walls of the second duct are aligned with side walls of the first duct, and secured to the first duct, so that a longitudinally extending volume exists between a top surface of the first duct and an interior of the second duct. In other words the first and second ducts are of a substantially common lateral extent with substantially vertically aligned side walls to contain the longitudinally extending volume between the top surface of the first duct and the interior of the second duct.

Thermal management systems including first ducts 102 or 152 and second ducts 104 in accordance with this disclosure may more effectively maintain operating temperatures of memory devices 116, and particularly next-generation memory devices 116, within target operating temperatures, in comparison to conventional cooling approaches. Experimental test results comparing the performance of thermal management systems including first ducts 102 or 152 and second ducts 104 in accordance with this disclosure and thermal management systems employing a singled-walled duct were obtained by simulating the thermal characteristics of otherwise identical systems utilizing FLOTHERM® Systems simulation software. For example, the operating temperatures experienced by memory devices 116 when using thermal management systems including first ducts 102 or 152 and second ducts 104 in accordance with this disclosure may be between about 80% and about 90% of the operating temperatures experienced in a thermal management system employing a singled-walled duct. More specifically, the operating temperatures experienced by memory devices 116 when using thermal management systems including first ducts 102 or 152 and second ducts 104 in accordance with this disclosure may be between about 82% and about 88% of the operating temperatures experienced in a thermal management system employing a singled-walled duct. As a specific, nonlimiting example, the operating temperatures experienced by memory devices 116 when using thermal management systems including first ducts 102 or 152 and second ducts 104 in accordance with this disclosure may be between about 83% and about 87% (e.g., about 85%) of the operating temperatures experienced in a thermal management system employing a singled-walled duct.

The operating temperatures experienced by memory devices 116 when using thermal management systems including first ducts 102 or 152 and second ducts 104 in accordance with this disclosure may be, for example, between about 5° C. and about 30° C. cooler than the operating temperatures experienced in a thermal management system employing a singled-walled duct. More specifically, the operating temperatures experienced by memory devices 116 when using thermal management systems including first ducts 102 or 152 and second ducts 104 in accordance with this disclosure may be, for example, between about 10° C. and about 25° C. cooler than the operating temperatures experienced in a thermal management system employing a singled-walled duct. As a specific, nonlimiting example, the operating temperatures experienced by memory devices 116 when using thermal management systems including first ducts 102 or 152 and second ducts 104 in accordance with this disclosure may be between about 12° C. and about 20° C. (e.g., about 15° C. or about 18° C.) cooler than the operating temperatures experienced in a thermal management system employing a singled-walled duct.

Figure 5:
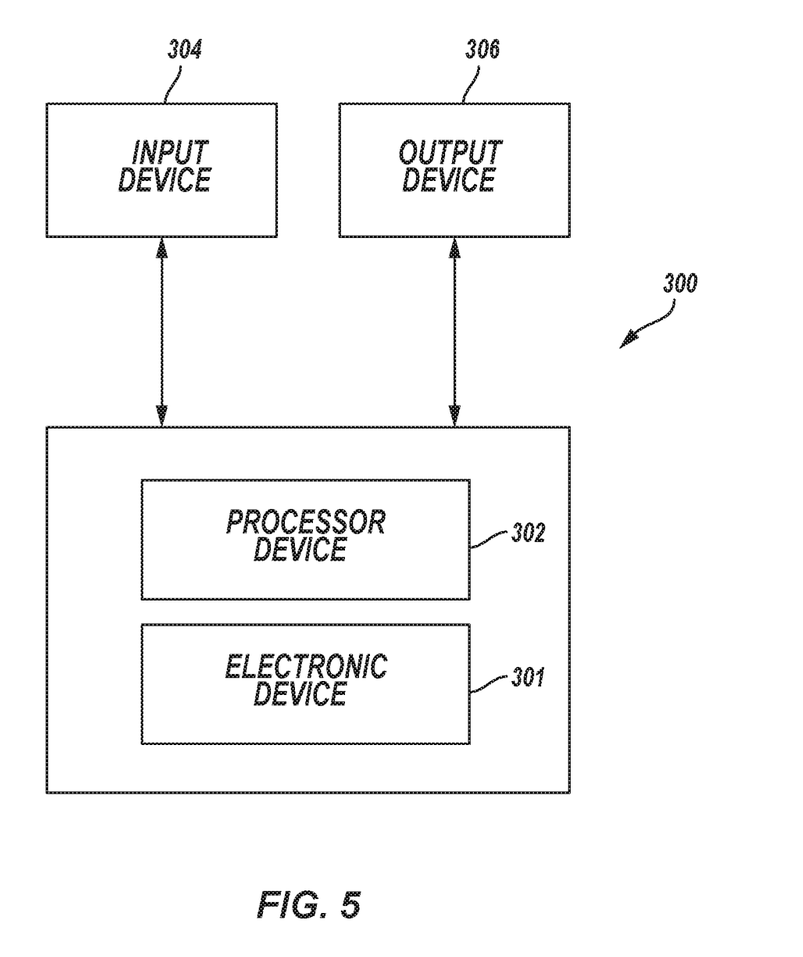
FIG. 5 is a schematic block diagram illustrating an embodiment of an electronic system that includes.

The assemblies a computing device 100 as shown in FIGS. 1 and 2 and incorporating cooling assemblies in accordance with embodiments of the disclosure may be used in embodiments of electronic systems of the present disclosure. For example, FIG. 5 is a block diagram of an illustrative electronic system 300 according to the present disclosure. The electronic system 300 may comprise, for example, a desktop or laptop computer or computer hardware component, a server or other networking hardware component, etc. The electronic system 300 includes an electronic device 301 in the form of at least one heat-generating component, for example and without limitation multiple longitudinally and vertically aligned memory modules in the form of DIMMs. The electronic system 300 further may include at least one electronic signal processor device 302 (often referred to as a "microprocessor"), such as processor 118. The electronic system 300 may, optionally, further include one or more input devices 304 for inputting information into the electronic system 300 by a user, such as, for example, a mouse or other pointing device, a keyboard, a touchpad, a button, or a control panel. The electronic system 300 may further include one or more output devices 306 for outputting information (e.g., visual or audio output) to a user such as, for example, a monitor, display, printer, speaker, etc. The one or more input devices 304 and output devices 306 may communicate electrically with at least one of the electronic device 301 and the electronic signal processor device 302. An embodiment of a cooling assembly according to the disclosure including at least one fan, a first duct and a second duct cooperatively arranged with respect to the electronic device as described above.

In summary, kits for cooling computing devices may include, for example, a fan and two ducts. A first duct may be sized and shaped to surround at least one heat-generating electronic component longitudinally aligned with the first duct on three sides of the at least one heat-generating component and to direct air flow from the fan over and around the at least one heat generating electronic component. A second duct may be sized and shaped to extend over the first duct in alignment therewith on at least one side, such that the first duct is interposed between the memory device and the second duct and a longitudinally extending volume exists between the first duct and the second duct.

Computing devices may include, for example, multiple, vertically and longitudinally extending, mutually adjacent heat-generating components and at least one fan proximate a longitudinal end of the multiple, vertically and longitudinally extending, mutually adjacent heat-generating components. A first longitudinally extending duct may be aligned with and surround the multiple, vertically and longitudinally extending, mutually adjacent heat-generating components on three sides, the first duct positioned to direct air flow from the fan within the duct around and between multiple, vertically and longitudinally extending, mutually adjacent heat-generating components. A second duct may extend over the first duct and provide a longitudinally extending volume between the first duct and the second duct for air flow from the at least one fan.

Electronic systems may include an input device, an output device, and a processor in operable communication with the input device and the output device. Multiple longitudinally and vertically aligned memory modules may be in operable communication with the processor. A cooling assembly may include at least one fan positioned to direct air flow toward and past the multiple longitudinally and vertically aligned memory modules, a first duct extending over and aligned with the multiple longitudinally and vertically aligned memory modules, and a second duct over the first duct defining a longitudinally extending volume therebetween.

Methods of cooling multiple longitudinally and vertically aligned memory modules may involve directing air flow toward the multiple longitudinally and vertically aligned memory modules. A portion of the air flow may be constrained around and between the multiple longitudinally and vertically aligned memory modules with a first duct. Another portion of the air flow may be constrained within a volume between at least an upper surface of the first duct and an interior of a second duct extending over the first duct.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A kit for cooling a computing device, comprising:
a fan;
a first duct sized and shaped to surround at least one heat-generating electronic component longitudinally aligned with the first duct on three sides of the at least one heat-generating electronic component and to direct air flow from the fan over and around the at least one heat-generating electronic component; and
a second duct sized and shaped to extend over the first duct in alignment therewith on at least one side, such that the first duct is interposed between the at least one heat-generating electronic component and the second duct and a longitudinally extending volume exists between the first duct and the second duct;
wherein the first duct comprises a heat sink structure located on an exterior side of the first duct.

2. The kit of claim 1, wherein a height of the first duct positioned to be located proximate to the at least one heat-generating component is greater than, or at least substantially equal to, a height of an upper extent of the at least one heat-generating component.

3. The kit of claim 1, wherein the heat sink is integral to a remainder of the first duct.

4. The kit of claim 1, wherein the heat sink is distinct from, and secured to, a remainder of the first duct.

5. The kit of claim 1, wherein the first duct comprises a metal material.

6. The kit of claim 1, wherein the second duct comprises a metal material or a polymer material.

7. The kit of claim 1, wherein the second duct surrounds the first duct on three sides thereof and the longitudinally extending volume is of U-shaped cross-section.

8. The kit of claim 1, wherein side walls of the second duct are substantially aligned with side walls of the first duct and secured to the first duct, the longitudinally extending volume existing between a top surface of the first duct and an interior of the second duct.

9. A computing device, comprising:
multiple, vertically and longitudinally extending, mutually adjacent heat-generating components;
at least one fan proximate a longitudinal end of the multiple, vertically and longitudinally extending, mutually adjacent heat-generating components;
a first longitudinally extending duct aligned with and surrounding the multiple, vertically and longitudinally extending, mutually adjacent heat-generating components on three sides, the first duct positioned to direct air flow from the fan within the duct around and between multiple, vertically and longitudinally extending, mutually adjacent heat-generating components; and
a second duct extending over the first duct and providing a longitudinally extending volume between the first duct and the second duct for air flow from the at least one fan,
wherein the first duct comprises a heat sink structure located on an upper surface of the first duct opposite the multiple, vertically and longitudinally extending mutually adjacent heat-generating components, the heat sink structure thermally coupled to the multiple, vertically and longitudinally extending mutually adjacent heat-generating component.

10. The computing device of claim 9, wherein an underlying surface of the first duct is spaced from the multiple, vertically and longitudinally extending, mutually adjacent heat-generating components.

11. The computing device of claim 9, wherein an underlying surface of the first duct is in thermal contact with the multiple, vertically and longitudinally extending, mutually adjacent heat-generating components.

12. The computing device of claim 9, wherein the first duct and the heat sink structure comprise a unitary structure.

13. The computing device of claim 9, wherein the heat sink structure is a separate structure from the first duct, and secured to the first duct.

14. The computing device of claim 9, wherein the first duct comprises a metal or metal alloy material.

15. The computing device of claim 9, wherein the second duct comprises a metal material or a polymer material.

16. The computing device of claim 9, further comprising at least one processor, the at least one processor located between the at least one fan and the multiple, vertically and longitudinally extending, mutually adjacent heat-generating components.

17. The computing device of claim 16, wherein the second duct extends longitudinally closer to the at least one processor than the first duct.

18. The computing device of claim 9, wherein the second duct extends over the first duct in spaced relation thereto, forming the longitudinally extending volume in a U-shaped cross-section.

19. The computing device of claim 18, wherein the first duct and the second duct are of a substantially common lateral extent with substantially mutually vertically aligned side walls to constrain the longitudinally extending volume between a top surface of the first duct and an interior of the second duct.

20. An electronic system, comprising:
an input device;
an output device;
a processor in operable communication with the input device and the output device;
multiple longitudinally and vertically aligned memory modules in operable communication with the processor; and
a cooling assembly comprising:
at least one fan positioned to direct air flow toward and past the multiple longitudinally and vertically aligned memory modules;
a first duct extending over and aligned with the multiple longitudinally and vertically aligned memory modules; and
a second duct over the first duct defining a longitudinally extending volume therebetween;
wherein the first duct comprises a heat sink structure located on an exterior side of the first duct.

21. The electronic system of claim 20, wherein the longitudinally extending volume extends around sides of the first duct.

22. A method of cooling multiple longitudinally and vertically aligned memory modules, the method comprising:
directing air flow toward the multiple longitudinally and vertically aligned memory modules;

constraining a portion of the air flow around and between the multiple longitudinally and vertically aligned memory modules with a first duct;

constraining another portion of the air flow within a volume between at least an upper surface of the first duct and an interior of a second duct extending over the first duct, and dissipating heat utilizing a heat sink structure located on an exterior side of the first duct.

23. The method of claim 22, wherein constraining the other portion of the air flow within a volume between at least an upper surface of the first duct and an interior of a second duct extending over the first duct further comprises constraining the other portion within a volume extending between sides of the first duct and sides of the second duct.

* * * * *

UNITED STATES PATENT AND TRADEMARK OFFICE
CERTIFICATE OF CORRECTION

PATENT NO. : 10,653,033 B1
APPLICATION NO. : 16/174810
DATED : May 12, 2020
INVENTOR(S) : Xiaopeng Qu and Hyunsuk Chun It is certified that error appears in the above-identified patent and that said Letters Patent is hereby corrected as shown below:

In the Claims

| | | | |
|---|---|---|---|
| Claim 9, | Column 12, | Line 5, | change "generating component." to --generating components.-- |
| Claim 22, | Column 13, | Line 7, | change "first duct, and" to --first duct; and-- |

Signed and Sealed this
Eleventh Day of August, 2020

Andrei Iancu
*Director of the United States Patent and Trademark Office*